United States Patent Office 3,034,970
Patented May 15, 1962

3,034,970

JET PLATING METHOD OF MANUFACTURE OF MICRO-ALLOY SEMICONDUCTOR DEVICES

George L. Schnable and John G. Javes, Lansdale, Pa., assignors, by mesne assignments, to Philco Corporation, Philadelphia, Pa., a corporation of Delaware
No Drawing. Filed June 6, 1960, Ser. No. 33,940
4 Claims. (Cl. 204—15)

This invention relates to the jet plating process of manufacture of micro-alloy semiconductor devices, such as transistors, in the course of which at least one diode junction is formed; for example in the case of a transistor diode junctions are formed at the emitter and collector elements. This invention relates more particularly to micro-alloy semiconductor devices employing cadmium electrodes, and it is concerned with the measurement of diode breakdown voltage which is essential in order better to control the manufacturing process, as hereinafter described.

For the present purpose, by way of example it will suffice to refer generally to the jet plating process of manufacture of micro-alloy transistors. For a detailed description thereof reference may be had to a copending application of R. A. Williams, Serial No. 669,852, filed July 3, 1957, assigned to the assignee of the present application, and now abandoned.

In the customary manufacture of micro-alloy transistors, a semiconductor wafer is jet etched to form opposed depressions or recesses therein so as to provide a thin base portion having flat opposed surfaces in said recesses, and the electrode metal is jet plated onto said surfaces and is subsequently micro-alloyed with the semiconductor wafer. The unit is later baked to drive off occluded gases and undesirable solvent materials.

For example, in the manufacture of certain micro-alloy transistors, small dots of the electrode metal are formed on such surfaces of a germanium wafer which has a resistivity gradient within the thin base portion between regions of relatively low and relatively high resistivity. Diode junctions are formed at the dots, and in order to control the process the diode breakdown voltages are measured. These voltages indicate whether the deposited dots are properly related to each other and to the resistivity gradient within the thin base portion, i.e. whether the etching and plating operations are being properly performed or whether some modification or adjustment of the process should be made.

In a copending application of G. L. Schnable, Serial No. 829,436, filed July 24, 1959, assigned to the assignee of the present application, there is disclosed and claimed a micro-alloy transistor employing cadmium as the electrode metal. As set forth in that application, the use of cadmium is advantageous, particularly because it has much better thermal properties than previously-used metals such as indium, and it can be subjected to higher temperatures without melting.

However, the use of a cadmium plating solution in the jet plating process gave rise to a problem in respect to the above-mentioned measurement of diode breakdown voltages. It was found that after the cadmium dots have been jet plated onto the germanium blank and the unit is rinsed and dried, the diode breakdown voltages drop very rapidly due to exposure of the unit to air. Generally, it is necessary to dry the unit and measure collector reverse characteristics in less than ten seconds after rinsing in order to measure the diode breakdown voltages with useful accuracy. This is very difficult and sometimes it is impossible.

It should be mentioned here that while the diodes at the plated dots degrade very rapidly at this intermediate stage of the manufacturing process, they are restored by the subsequent micro-alloying operation and accompanying rinses.

The principal object of the present invention is to provide a satisfactory solution of the above-mentioned problem.

In the past, the presence of any impurity or contaminant in a jet plating solution has been deemed undesirable, as it has seemed logical that any contaminant would tend adversely to affect the jet plating process and the semiconductor devices produced thereby. We have discovered, however, that if the jet plating is conducted with a cadmium plating solution containing a very small amount or trace of an impurity metal selected from the group comprising silver, rhodium, gold, palladium and platinum, the diode characteristics are maintained for at least an hour following the plating of the cadmium dots, and there is no adverse effect on the transistor. The impurity metal may be added by adding to the plating solution a predetermined amount of soluble metal salt.

While it is not definitely known why each of the above-mentioned metals is effective to retain the diode characteristics, it is believed that a small amount of the impurity metal is codeposited with the cadmium on the semiconductor blank and that this delays the degradation of the diodes.

A plating solution in accordance with this invention may be prepared by the addition of a prepared impurity solution in the course of preparation of the cadmium plating solution. For example, a silver nitrate solution may be prepared as follows: Weigh out 0.0703 to 0.0713 gram of silver nitrate into a 250-ml. volumetric flask. Add about 200 ml. of deionized water. Dissolve by agitating the flask. After the silver nitrate is dissolved, dilute to 250 ml., and mix thoroughly by agitating the flask.

The amount of the prepared silver nitrate solution to be added to the cadmium plating solution during preparation of the latter naturally depends on the desired silver concentration. Expressing the silver concentration in p.p.m. (parts of silver per million parts of plating solution), we have found that a range of silver concentrations suitable for the purpose of this invention is from 0.01 to 0.25 p.p.m. For 18 liters of plating solution, the amount of silver nitrate solution required may be determined by multiplying the desired silver concentration by 100. For example, if the desired silver concentration is 0.02 p.p.m., the amount of silver nitrate solution required is 2 ml.

In the preparation of the cadmium plating solution, a concentrated cadmium fluoborate solution containing 40 to 60 percent by weight of pure cadmium fluoborate may be used. In 18 liters of plating solution there may be 137.3 grams of pure cadmium fluoborate. Assuming that the cadmium fluoborate solution to be employed has a concentration of about 49 percent, 280 grams of the solution may be used in the preparation of 18 liters of plating solution.

The plating solution may be prepared as follows. Add about 16 liters of deionized water to a 5-gallon Pyrex carboy calibrated to 18 liters. The amount of cadmium fluoborate solution required is determined by $$\frac{137.3}{0.49}=280 \text{ grams}$$

Add this amount to the carboy. Mix thoroughly by bubbling nitrogen through the solution for 10 minutes at a rate sufficient for good mixing. Add the required amount of silver nitrate solution. Dilute the solution to 18 liters with deionized water. Bubble nitrogen through the solution for at least 10 minutes to mix the solution thoroughly as before. Determine the pH of the solution by means of a pH meter which has been standardized against a buffer solution having a pH of 2.00. Measure the temperature to the nearest degree centigrade and adjust the pH meter accordingly. The acceptable pH range is 2.1 to 2.4. If the pH of the solution is too high, fluoboric acid should be added. If the pH is too low, it should be raised by adding a small amount of concentrated ammonium hydroxide. After each addition of fluoboric acid or ammonium hydroxide, the solution should be mixed by bubbling with nitrogen for at least 10 mintues before another pH reading is taken.

Just before the plating solution is to be used, 2.5 ml. of a 15% aqueous solution of decyl benzene sodium sulfonate should be added to the 18 liter batch of plating solution, and nitrogen should be bubbled gently through the solution for 5 minutes to mix it.

While silver is the preferred additive metal for the purpose of this invention, the other metals hereinbefore mentioned may also be employed. Regardless of which metal is employed, the procedure is the same as above described, i.e., the additive solution is prepared and is added to the cadmium plating solution during preparation of the latter. With respect to said other metals, the following approximate concentrations have been found to be useful for the purpose of this invention: gold 0.5 to 2 p.p.m.; palladium 1 to 5 p.p.m.; platinum 0.5 to 5 p.p.m.; rhodium 0.5 to 5 p.p.m.

In the process according to this invention as presently employed, the cadmium fluoborate plating solution generally used contains .02 p.p.m. silver. The current density range is 9–12 microamperes per circular mil of jet orifice (the number of circular mil is the diameter of the jet orifice expressed in mils squared). Jet to blank spacing is 1/10 inch. With a current of 200 microamperes, a 4.2 mil jet giving a current density of 11 microamperes per circular mil, and a seven second plating time, a plating diameter of about 8 mils is obtained. A flow rate of 8 ml./min. is used.

While the invention has been described with particular reference to the preferred embodiment, it will be understood that the invention is not limited thereto but contemplates such other embodiments as may be utilized.

We claim:

1. In the manufacture of micro-alloy semiconductor devices involving jet plating of at least one cadmium element onto a semiconductor blank which forms a diode junction at said element, after which it is desired to measure the diode breakdown voltage which tends to drop rapidly after rinsing and drying, the improvement which consists in conducting the jet plating with an aqueous cadmium-impurity metal plating solution from which cadmium and impurity metal may be plated out during the jet plating, said plating solution containing in solution a predetermined small quantity of said impurity metal, selected from the group consisting of silver, rhodium, gold, palladium and platinum, sufficient only to maintain the diode characteristics for a substantial period of time.

2. In the manufacture of micro-alloy semiconductor devices involving jet plating of at least one cadmium element onto a semiconductor blank which forms a diode junction at said element, after which it is desired to measure the diode breakdown voltage which tends to drop rapidly after rinsing and drying, the improvement which consists in conducting the jet plating with an aqueous cadmium-silver plating solution from which both cadmium and silver may be plated out during the jet plating, said plating solution containing in solution a predetermined small quantity of silver sufficient only to maintain the diode characteristics for a substantial period of time.

3. The method of claim 2, wherein a cadmium plating solution is employed containing in solution a quantity of silver within the range 0.01 to 0.25 part of silver per million parts of plating solution.

4. The method of claim 2, wherein a cadmium plating solution is employed containing silver in solution substantially in the quantity 0.02 part per million parts of plating solution.

References Cited in the file of this patent

UNITED STATES PATENTS 2,873,232 Zimmerman ------------ Feb. 10, 1959

OTHER REFERENCES

Fink et al.: I, "The Metal Industry," November 1930, pages 519–521.

Fink et al.: II, "The Metal Industry," December 1930, pages 562–563.